(12) United States Patent
Kanai et al.

(10) Patent No.: US 8,969,981 B2
(45) Date of Patent: Mar. 3, 2015

(54) SENSOR PACKAGE

(75) Inventors: Akinobu Kanai, Kyoto (JP); Yoshitaka Adachi, Kyoto (JP); Masao Shimizu, Shiga (JP); Junichi Tanaka, Kyoto (JP); Sho Sasaki, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/003,343

(22) PCT Filed: Feb. 21, 2012

(86) PCT No.: PCT/JP2012/054082
§ 371 (c)(1),
(2), (4) Date: Oct. 4, 2013

(87) PCT Pub. No.: WO2012/124437
PCT Pub. Date: Sep. 20, 2012

(65) Prior Publication Data
US 2014/0021565 A1  Jan. 23, 2014

(30) Foreign Application Priority Data

Mar. 14, 2011 (JP) ................................. 2011-055972

(51) Int. Cl.
*H01L 23/31* (2006.01)
*B81B 7/00* (2006.01)
*H01L 23/055* (2006.01)
*G01L 19/14* (2006.01)
*H01L 23/13* (2006.01)
(Continued)

(52) U.S. Cl.
CPC ............ *B81B 7/0048* (2013.01); *H01L 23/055* (2013.01); *G01L 19/141* (2013.01); *H01L 23/13* (2013.01); *H01L 23/562* (2013.01); *G01L 19/145* (2013.01); *H01L 23/49827* (2013.01); *H01L 2224/48247* (2013.01); *H01L 2224/48465* (2013.01); *H01L 2224/73265* (2013.01)
USPC ......................................................... 257/419

(58) Field of Classification Search
CPC .............................. H01L 23/31; H01L 23/498
USPC ......................................................... 257/419
See application file for complete search history.

(56) References Cited

U.S. PATENT DOCUMENTS

| 6,058,020 A | 5/2000 | Winterer et al. |
| 2004/0232507 A1 | 11/2004 | Furukubo et al. |

(Continued)

FOREIGN PATENT DOCUMENTS

| JP | H01-172721 A | 7/1989 |
| JP | 2-103194 A | 4/1990 |

(Continued)

OTHER PUBLICATIONS

International Search Report for International Application No. PCT/JP2012/054082, mailed May 22, 2012 (4 pages).
Office Action issued in corresponding Japanese Application No. 2011-055972 dated Sep. 16, 2014, and English translation thereof (8 pages).

*Primary Examiner* — Marc Armand
(74) *Attorney, Agent, or Firm* — Osha Liang LLP

(57) ABSTRACT

A sensor package has a semiconductor sensor chip, and a package body that has a semiconductor sensor chip mounting region on which the semiconductor sensor chip is mounted. The package body being a resin injection molded product. A groove is formed in a rear surface on an opposite side to a surface, on which the semiconductor sensor chip is mounted, so as to surround the semiconductor sensor chip mounting region. A coupling section is formed in the rear surface to couple a resin portion inside the groove and a resin portion outside the groove.

14 Claims, 17 Drawing Sheets

(51) Int. Cl.
*H01L 23/00* (2006.01)
*H01L 23/498* (2006.01)

(56) References Cited

U.S. PATENT DOCUMENTS

| | | |
|---|---|---|
| 2007/0045787 A1* | 3/2007 | Ino ............................... 257/666 |
| 2008/0224304 A1* | 9/2008 | Watanabe et al. ............. 257/702 |
| 2009/0194860 A1 | 8/2009 | Holzmann et al. |

FOREIGN PATENT DOCUMENTS

| | | |
|---|---|---|
| JP | 2-255390 A | 10/1990 |
| JP | 4-1094 A | 1/1992 |
| JP | 6-270579 A | 9/1994 |
| JP | 9-95076 A | 4/1997 |
| JP | 2004-003886 A | 1/2004 |
| JP | 2009-071251 A | 4/2009 |
| JP | 2009-537802 A | 10/2009 |

* cited by examiner

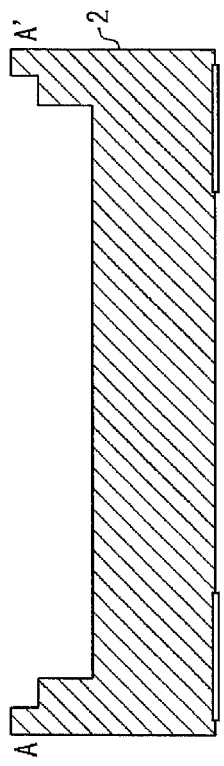
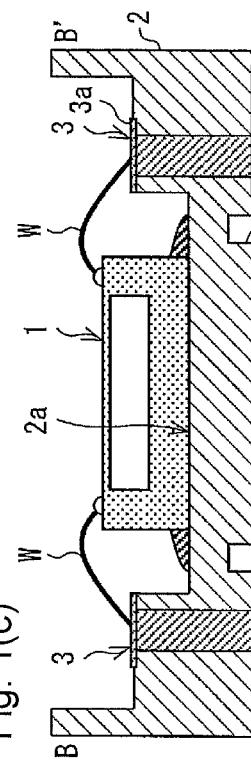
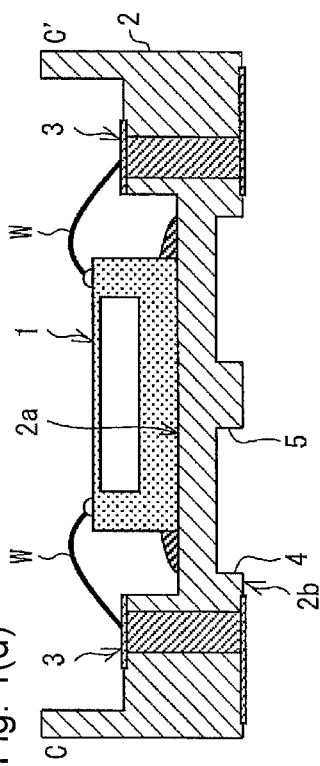
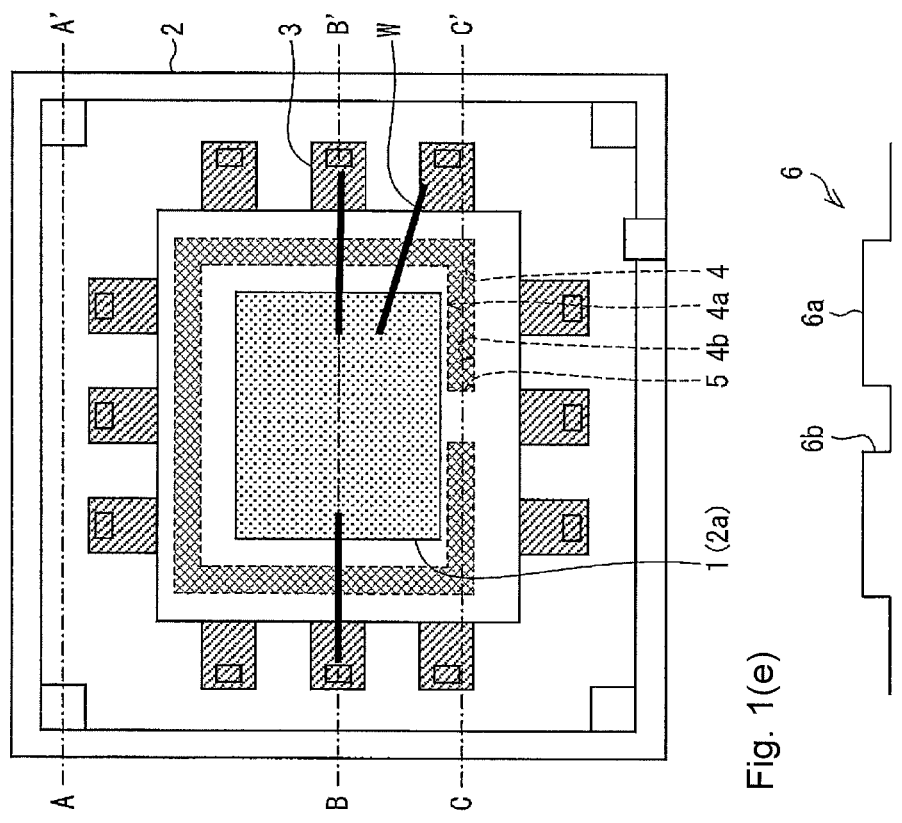
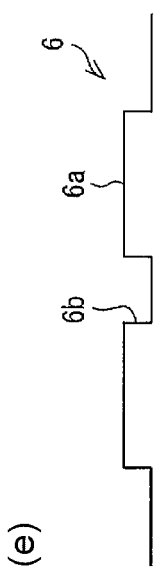

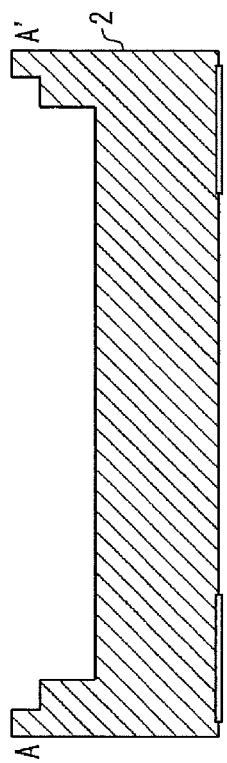
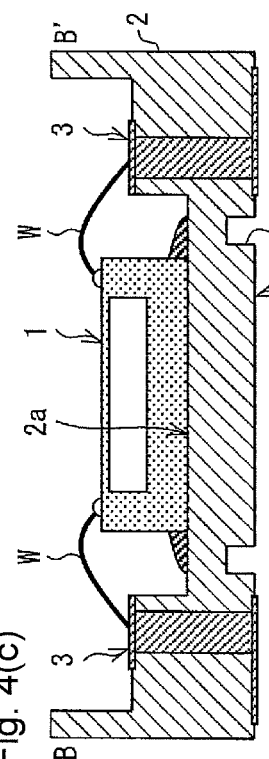
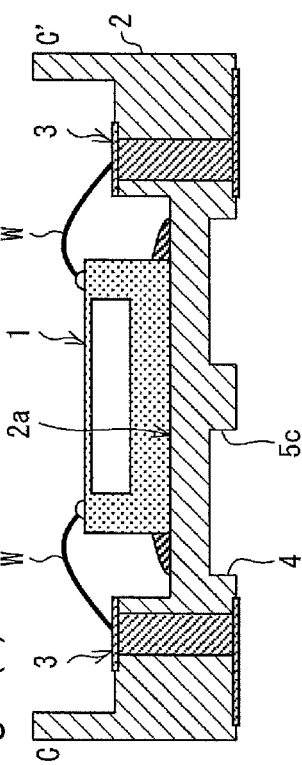
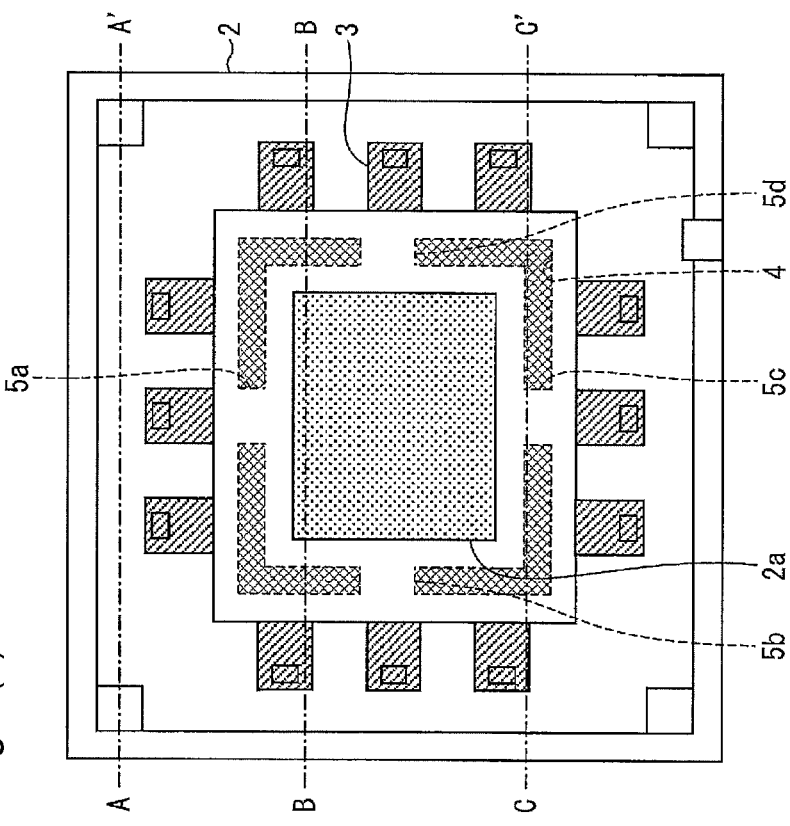
Fig. 4(a)
Fig. 4(b)
Fig. 4(c)
Fig. 4(d)

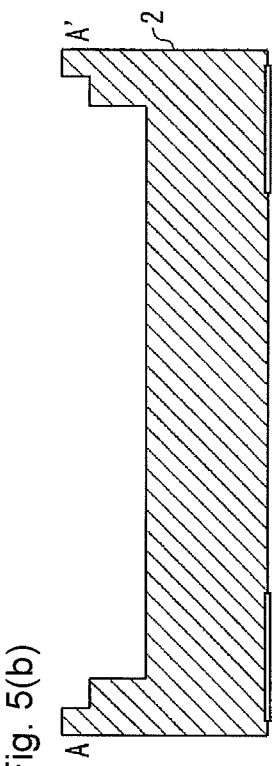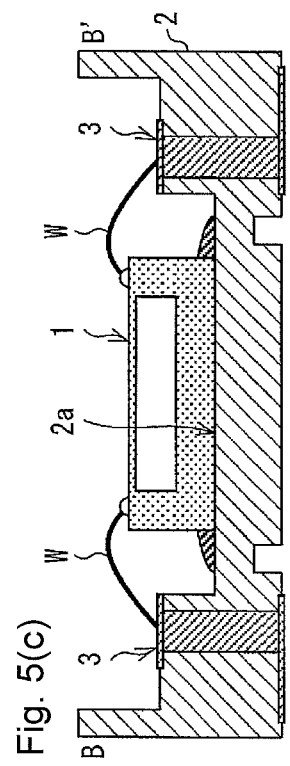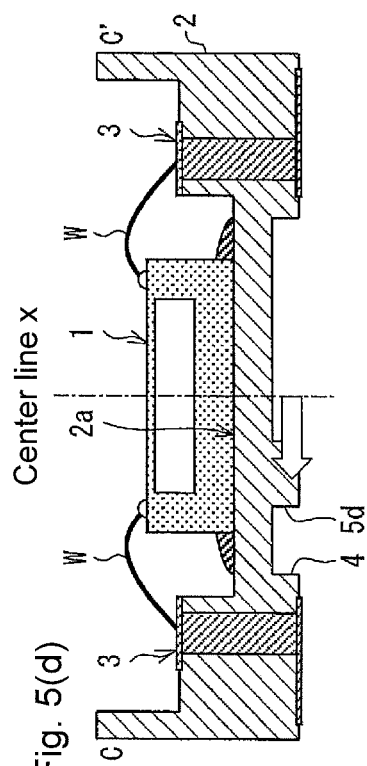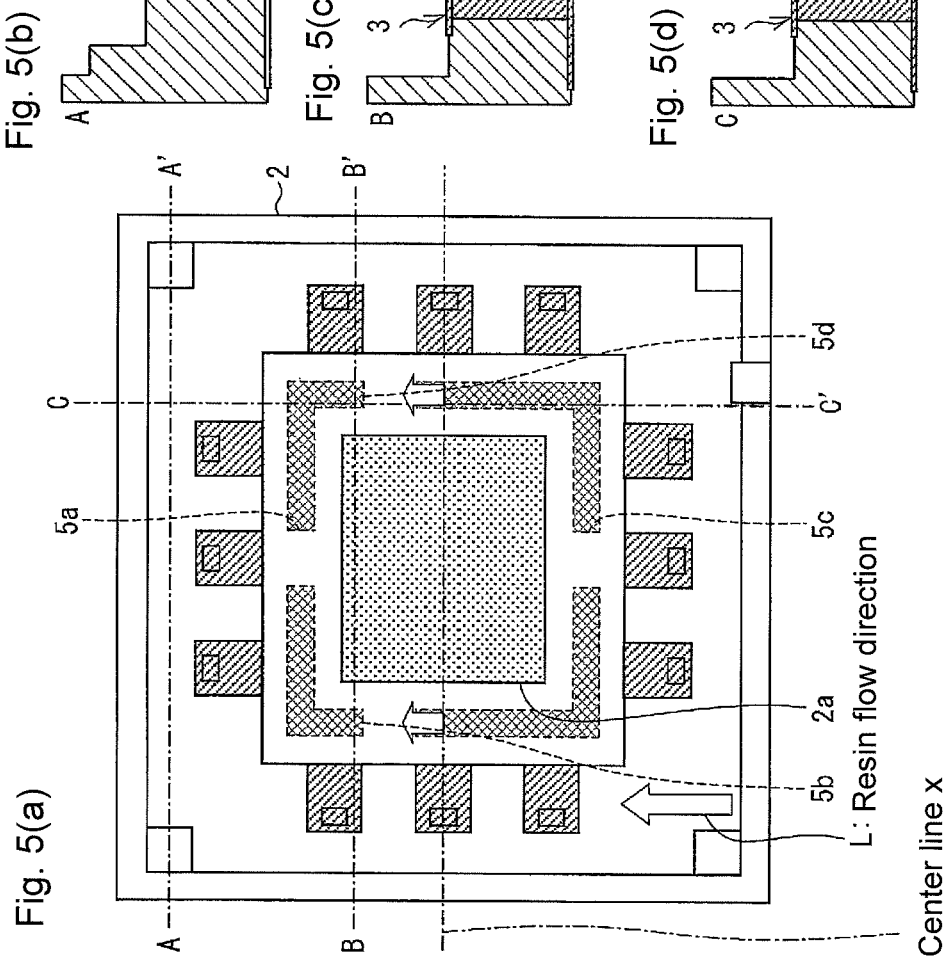

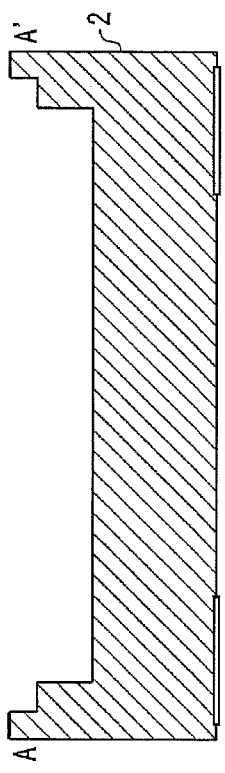
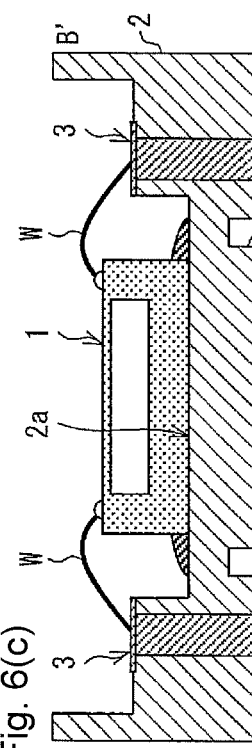
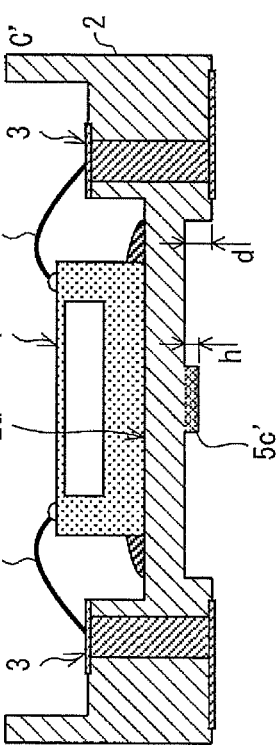
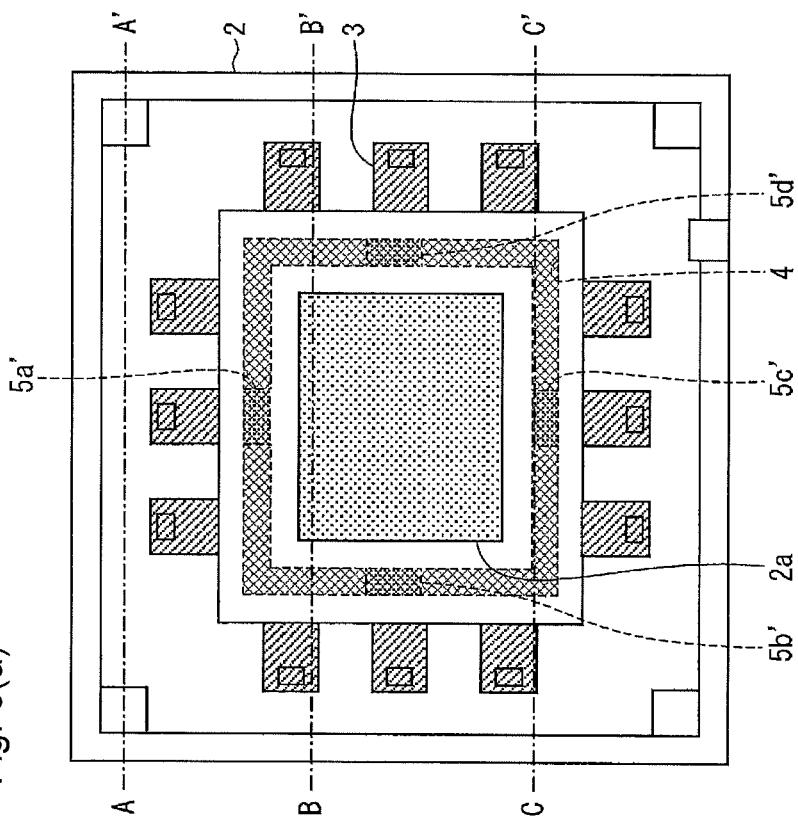
Fig. 6(a)
Fig. 6(b)
Fig. 6(c)
Fig. 6(d)

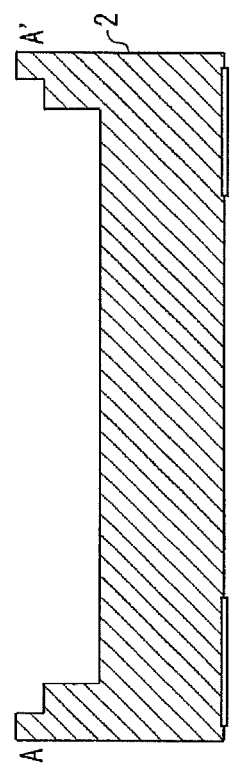
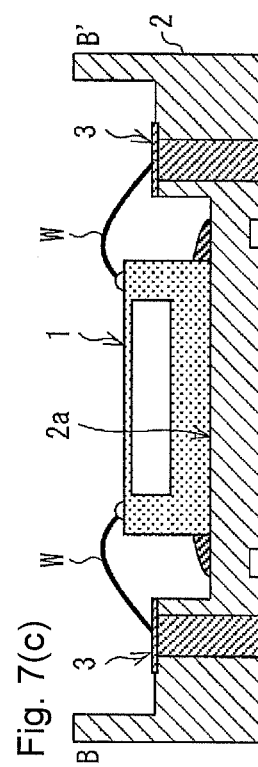
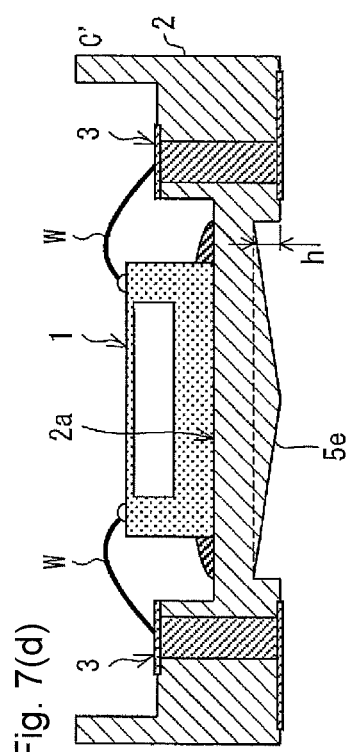
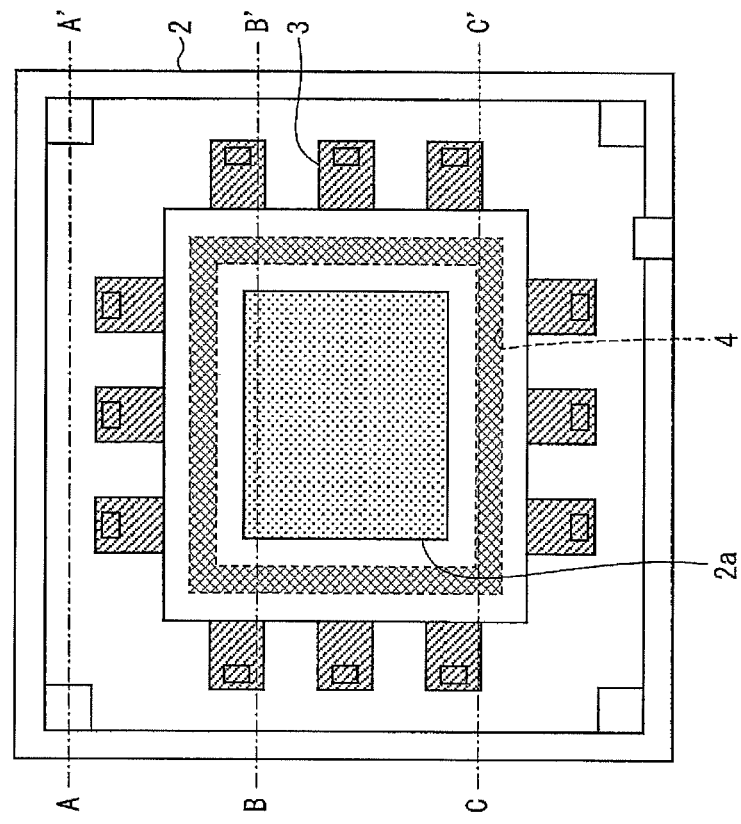
Fig. 7(a)
Fig. 7(b)
Fig. 7(c)
Fig. 7(d)

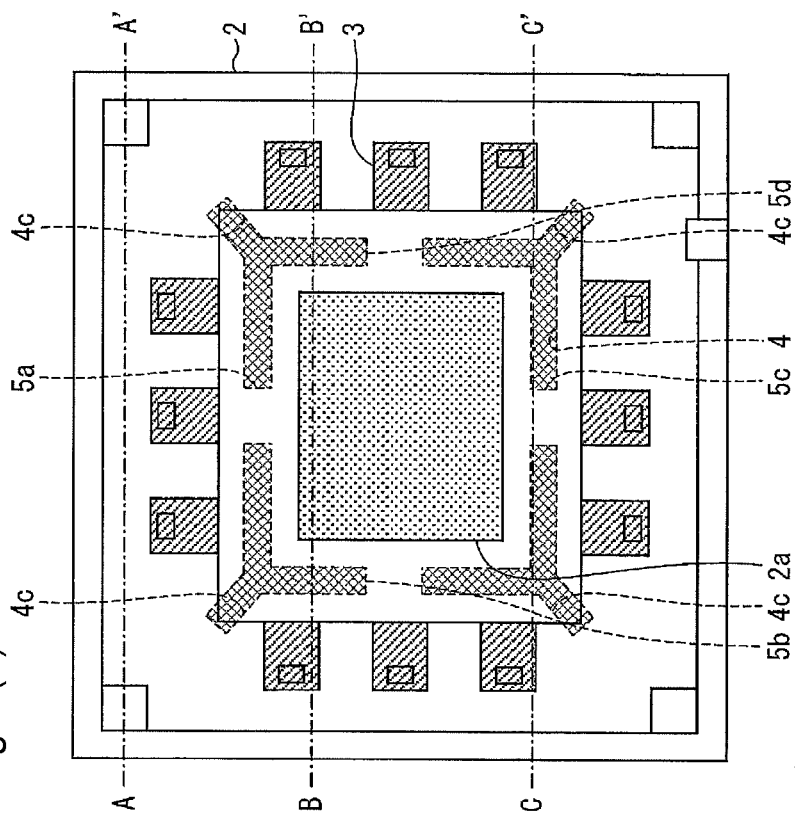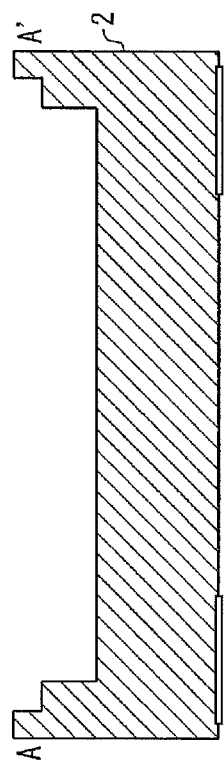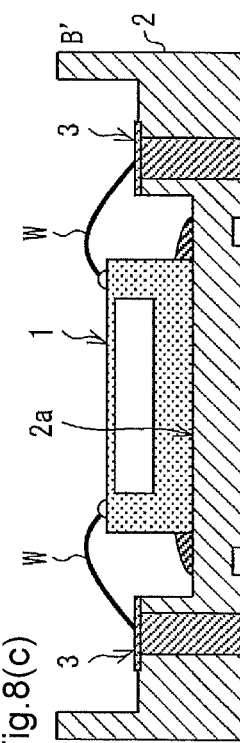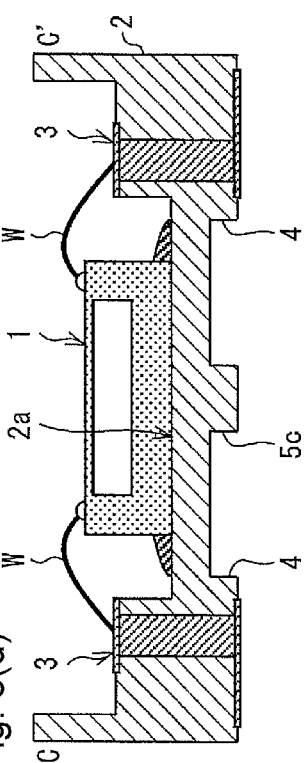
Fig. 8(a)
Fig. 8(b)
Fig. 8(c)
Fig. 8(d)

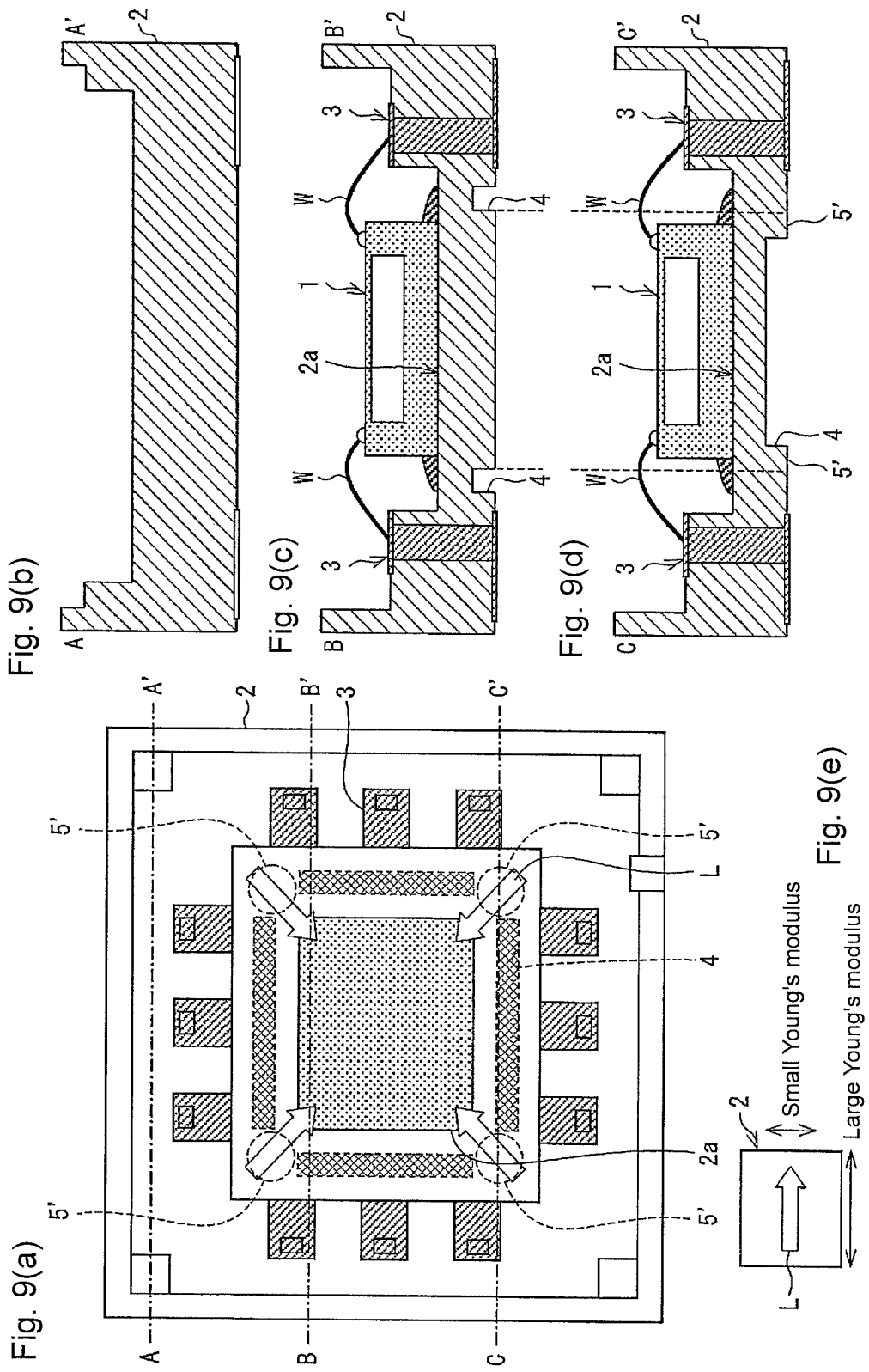

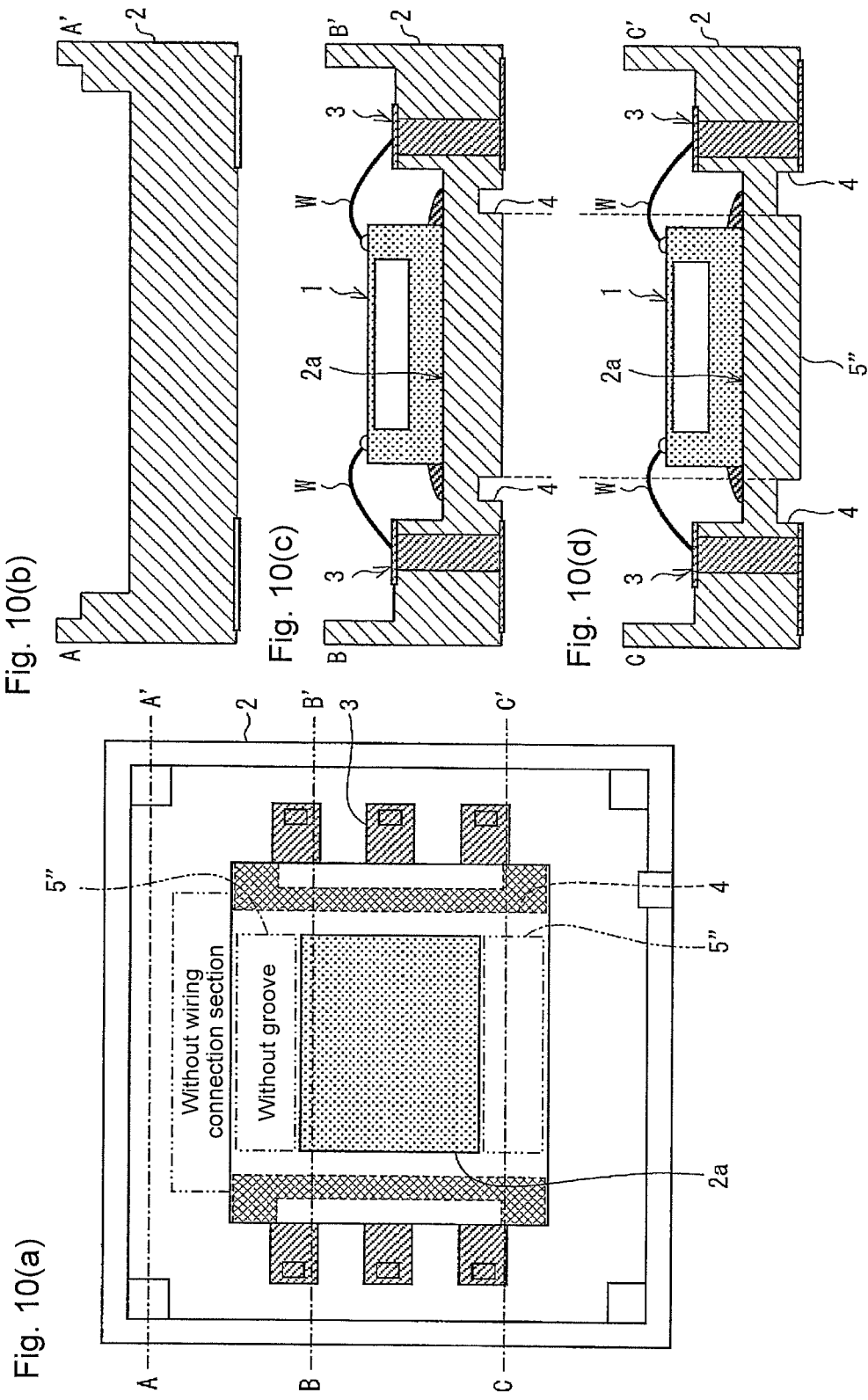

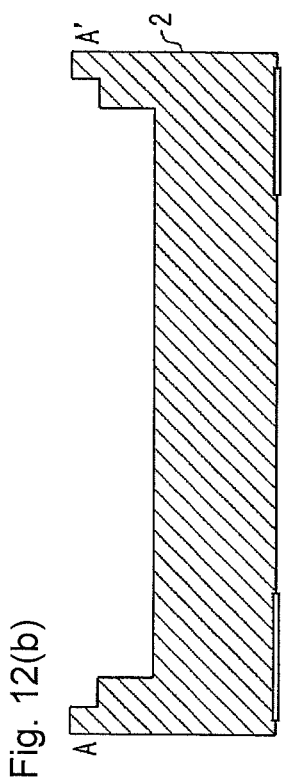
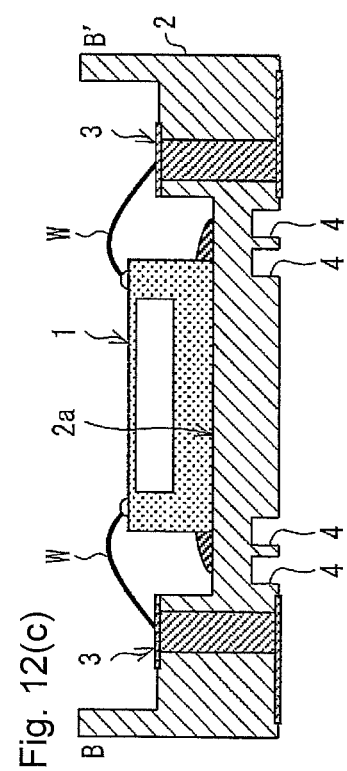
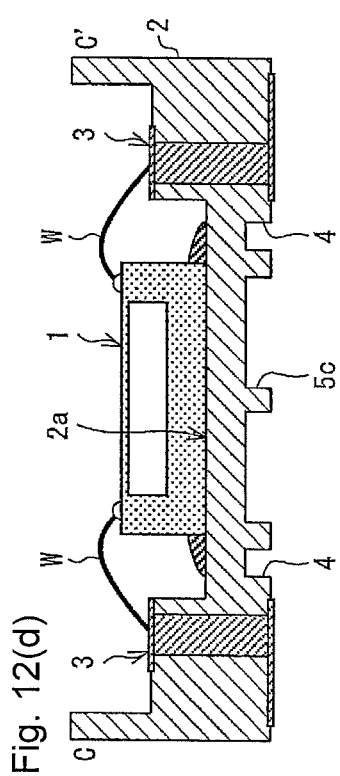
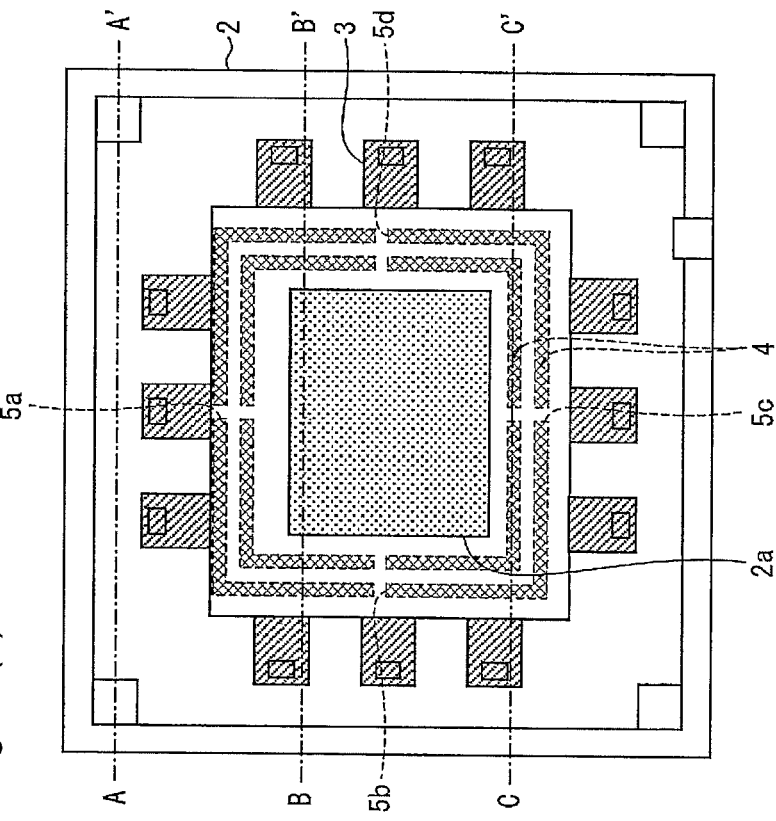
Fig. 12(a)
Fig. 12(b)
Fig. 12(c)
Fig. 12(d)

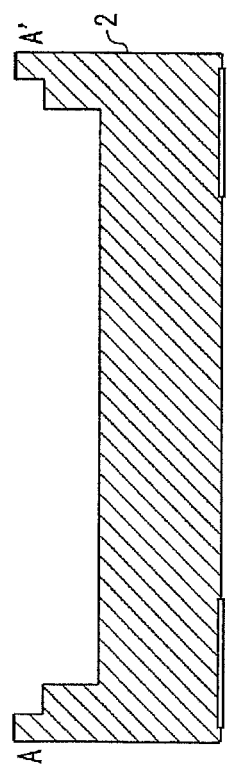
Fig. 13(a)
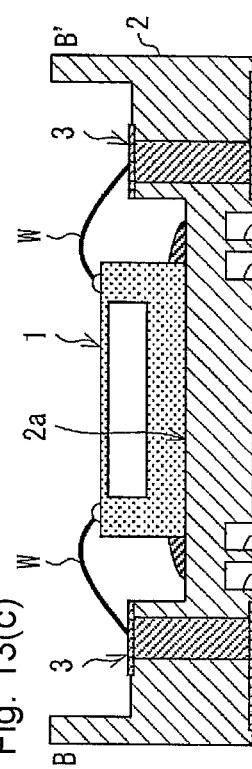
Fig. 13(b)
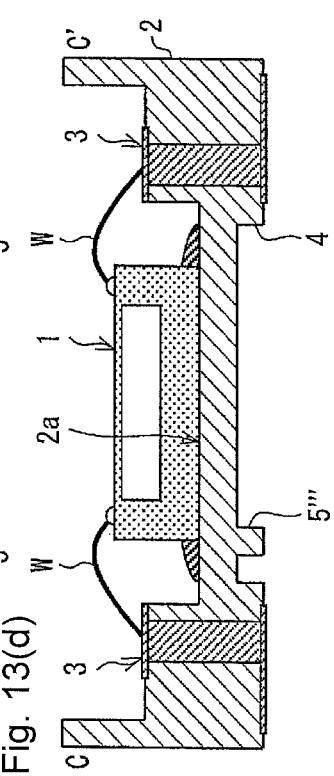
Fig. 13(c)
Fig. 13(d)

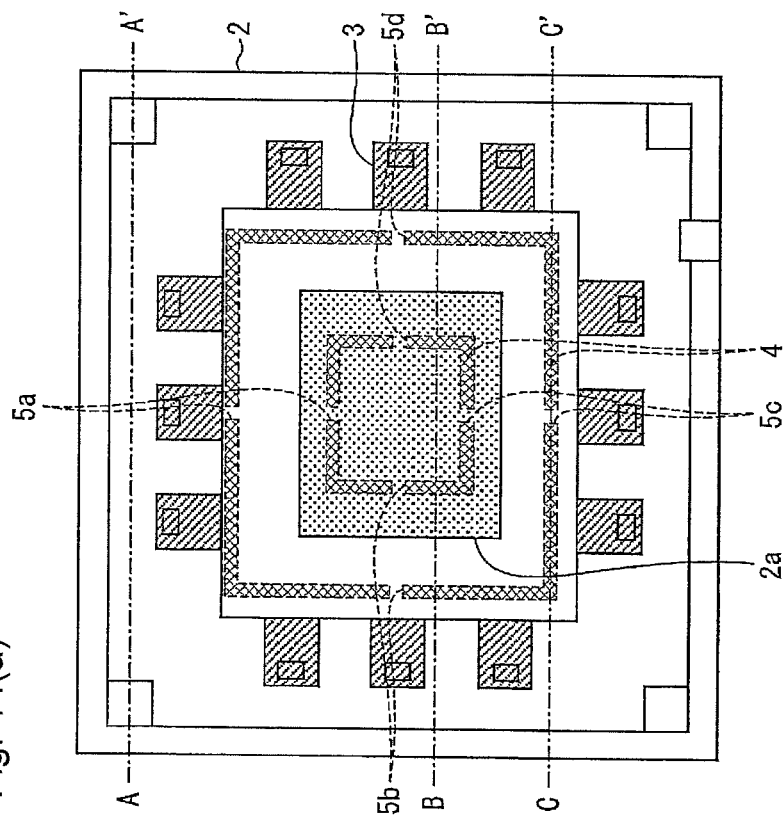
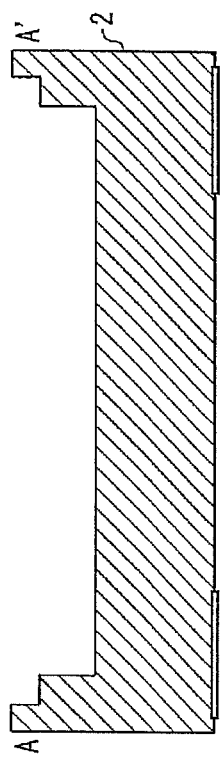
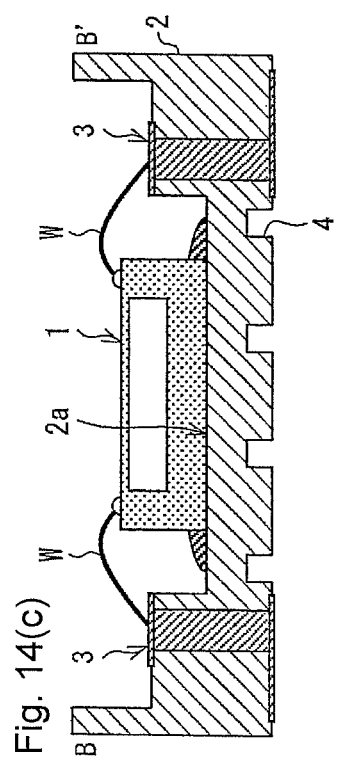
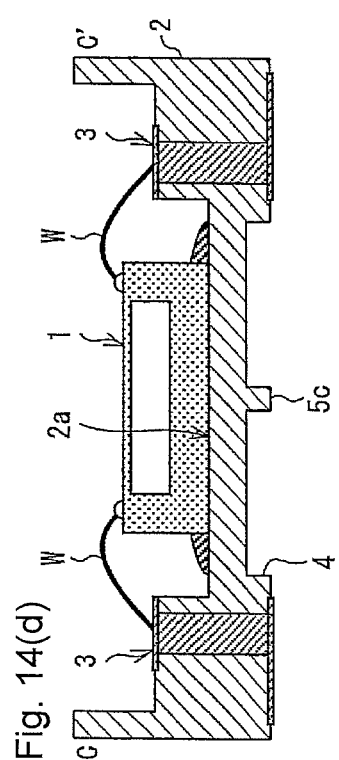

SENSOR PACKAGE

BACKGROUND

1. Technical Field

The present invention relates to a sensor package in which a semiconductor sensor chip is accommodated.

2. Related Art

For example, technologies disclosed in Patent Documents 1 to 3 are well known as a measure to relax an external stress in a mounting structure of a semiconductor element such as a semiconductor chip and a semiconductor sensor.

The technology disclosed in Patent Document 1 is a technology related to a resin mold package which the semiconductor chip is mounted on and accommodated in. Specifically, as illustrated in FIG. 15, a bottom surface 103 of a portion 102 on which a semiconductor chip 101 is mounted is molded into an inverted V-shape in a resin mold package 100 disclosed in Patent Document 1. Therefore, the resin mold package 100 has a structure in which the external stress is absorbed by the inverted V-shaped bottom surface 103, which allows the external stress to be relaxed.

The technology disclosed in Patent Document 2 is a technology related to a flip-chip BGA package on which the semiconductor chip is mounted. Specifically, as illustrated in FIG. 16, a semiconductor chip 201 is mounted on a flip-chip BGA board 202 in a flip-chip way. In the flip-chip BGA board 202, a BGA solder balls 203 that are electrically connected to wiring in the board are formed on a surface on an opposite side to the semiconductor chip 201. A groove 204 is formed in a rear surface of a position where the semiconductor chip 201 is mounted along an external form of the semiconductor chip 201 or an outer periphery of the external form. Therefore, connection reliability of the BGA solder ball 203 is improved when the flip-chip BGA package is partially mounted on a motherboard.

The technology disclosed in Patent Document 3 is a technology related to a sensor package in which a semiconductor sensor chip is accommodated. Specifically, as illustrated in FIGS. 17(a) and 17(b), a sensor package 300 disclosed in Patent Document 3 includes a rectangular-box-shaped package 302 and a lid 303. One of surfaces of the package 302 is opened, and a semiconductor sensor chip 301 is fixed to the package 302 therethrough. The lid 303 covers the package 302. The sensor package 300 is mounted on the mounting board 304 using solder, and the package 302 is constrained by a solder portion made of solder. A groove 304 is formed in the package 302 along four sides of the semiconductor sensor chip 301. The stress from the side of the mounting board 304 is relaxed by the groove 304.

Patent Document 1: U.S. Pat. No. 6,058,020 (Published on May 2, 2000)

Patent Document 2: Japanese Unexamined Patent Publication No. 2009-71251 (Published on Apr. 2, 2009)

Patent Document 3: Japanese Unexamined Patent Publication No. 2004-3886 (Published on Jan. 8, 2004)

SUMMARY

In the technology disclosed in Patent Document 1, the bottom surface 103 of the portion 102 on which the semiconductor chip 101 is mounted is raised by the inverted V-shape in order to relax the stress, and a space is provided between the resin mold package 100 and the mounting board. Therefore, a height of the resin mold package 100 increases by the space. In a configuration of the Patent Document 1, it is difficult that the stress is relaxed while a low-profile package is constructed. Additionally, because the bottom surface 103 of the portion 102 on which the semiconductor chip 101 is mounted is formed into the inverted V-shape, the resin mold package 100 is in point contact with the mounting board. Therefore, possibly the connection reliability between the resin mold package 100 and the mounting board is degraded, or the resin mold package 100 is broken due to a stress concentration.

In the technology disclosed in Patent Document 2, the BGA solder ball 203 is also formed between the grooves 204 on the surface on the opposite side to the semiconductor chip 201. The BGA solder ball 203 between the grooves 204 is also connected to the motherboard when the flip-chip BGA package is partially mounted on the motherboard. Therefore, possibly the stress is transmitted from the motherboard to a mounting region on which semiconductor chip 201 is mounted in the flip-chip BGA board 202.

Additionally, in the package of Patent Document 2, the groove 204 is formed in the rear surface of the position where the semiconductor chip 201 is mounted along the external form of the semiconductor chip 201 or the outer periphery of the external form. Similarly, in the sensor package of Patent Document 3, the groove 304 is formed along the four sides of the semiconductor sensor chip 301. Unfortunately injection molding is hardly performed in the case that the structure in which the groove is formed in the package along the four sides of the semiconductor element mounting region is formed by the injection molding. FIG. 18 is a plan view for explaining the case that the structure in which the groove is formed along the four sides of the semiconductor element mounting region is formed by the injection molding.

Generally, in the case that the groove is formed along the four sides of the semiconductor element mounting region by the injection molding, a metallic mold used in the injection molding has four projections corresponding to the groove along the four sides. A prismatic tube is formed by the four projections.

In FIG. 18, a portion comparable to the inside of the prismatic tube is indicated by a dotted line 305a. As illustrated in FIG. 18, in the case that resin is flown into the metallic mold in a direction L to form the structure of the groove along the four sides, because of a narrow flow path near the prismatic tube in the metallic mold, the resin hardly flows to the inside (the portion surrounded by the dotted line 305a) of the prismatic tube comparable to the groove 4. In the package formed by the injection molding, the inside portion surrounded by the groove is insufficiently filled with the resin, and a defect is generated due to short molding.

Therefore, the injection molding is hardly performed in the stress relaxation structure of the conventional mounting package disclosed in Patent Documents 2 and 3.

One or more embodiments of the present invention provides a sensor package in which the injection molding can easily be performed to the stress relaxation structure including the groove, in which the injection molding is hardly performed in the conventional technology, while the stress relaxation effect is maintained.

A sensor package according to one or more embodiments of the present invention includes: a semiconductor sensor chip; and a package body that has a semiconductor sensor chip mounting region on which the semiconductor sensor chip is mounted, the package body being a resin injection molded product. Herein, a groove is formed in a rear surface on an opposite side to a surface, on which the semiconductor sensor chip is mounted, so as to surround the semiconductor sensor chip mounting region, and a coupling section is formed in the rear surface to couple a resin portion inside the groove and a resin portion outside the groove.

According to the configuration, the external stress generated in mounting the sensor package is relaxed by the groove because the groove is formed in the rear surface on the opposite side to the surface, on which the semiconductor sensor chip is mounted, so as to surround the semiconductor sensor chip mounting region. Accordingly, the deformation of the semiconductor sensor chip mounting region due to the sensor package mounting is reduced, so that an influence of the external force applied to the semiconductor sensor chip can be decreased.

Additionally, according to the configuration, the coupling section is formed in the rear surface in order to couple the resin portion inside the groove and resin portion outside the groove, the metallic mold used in the injection molding for the groove structure includes the notch corresponding to the coupling section. During the resin injection molding, the notch acts as the inflow port through which the resin flows into the inside region of the groove, the resin flows easily into the inside region of the groove, and the inside region of the groove is sufficiently filled with the resin. Therefore, with the above configuration, the short-molding-free package can be constructed.

As described above, according to the configuration, one or more embodiments of the present invention can provide the sensor package in which the injection molding can easily be performed to the stress relaxation structure including the groove, in which the injection molding is hardly performed in the conventional technology, while the stress relaxation effect is maintained.

According to one or more embodiments of the present invention, advantageously the injection molding can easily be performed to the stress relaxation structure including the groove in which the injection molding is hardly performed in the conventional technology while the stress relaxation effect is maintained.

BRIEF DESCRIPTION OF THE DRAWINGS

FIGS. 1(a)-(e) illustrate a schematic configuration of a sensor package according to one or more embodiments of the present invention, FIG. 1(a) is a plan view, FIG. 1(b) is a sectional view taken on a line A-A' in FIG. 1(a), FIG. 1(c) is a sectional view taken on a line B-B' in FIG. 1(a), FIG. 1(d) is a sectional view taken on a line C-C' in FIG. 1(a), and FIG. 1(e) is a sectional view illustrating a structure of a metallic mold corresponding to a sectional structure in FIG. 1(d).

FIG. 2(a) is a plan view for explaining moldability of a package body 2, and FIG. 2(b) is a graph illustrating a stress relaxation effect.

FIG. 3(a) is a graph illustrating a comparison result of the stress relaxation effect with respect to a configuration in which a groove is formed in a surface on which a semiconductor sensor chip is mounted and a configuration in which the groove is formed in a rear surface on an opposite side to the surface on which the semiconductor sensor chip is mounted, and FIG. 3(b) is a schematic diagram for explaining a stress generated in mounting the semiconductor sensor chip with respect to the sensor packages having configurations (I) and (III) in FIG. 3(a).

FIGS. 4(a)-(d) illustrate[a schematic configuration of a sensor package according to a first modification, FIG. 4(a) is a plan view, FIG. 4(b) is a sectional view taken on the line A-A' in FIG. 4(a), FIG. 4(c) is a sectional view taken on the line B-B' in FIG. 4(a), and FIG. 4(d) is a sectional view taken on the line C-C' in FIG. 4(a).

FIGS. 5(a)-(d) illustrate a schematic configuration of a sensor package according to a second modification, FIG. 5(a) is a plan view, FIG. 5(b) is a sectional view taken on the line A-A' in FIG. 5(a), FIG. 5(c) is a sectional view taken on the line B-B' in FIG. 5(a), and FIG. 5(d) is a sectional view taken on the line C-C' in FIG. 5(a).

FIGS. 6(a)-(d) illustrate a schematic configuration of a sensor package according to a third modification, FIG. 6(a) is a plan view, FIG. 6(b) is a sectional view taken on the line A-A' in FIG. 6(a), FIG. 6(c) is a sectional view taken on the line B-B' in FIG. 6(a), and FIG. 6(d) is a sectional view taken on the line C-C' in FIG. 6(a).

FIGS. 7(a)-(d) illustrate a schematic configuration of a sensor package according to a fourth modification, FIG. 7(a) is a plan view, FIG. 7(b) is a sectional view taken on the line A-A' in FIG. 7(a), FIG. 7(c) is a sectional view taken on the line B-B' in FIG. 7(a), and FIG. 7(d) is a sectional view taken on the line C-C' in FIG. 7(a).

FIGS. 8(a)-(d) illustrate a schematic configuration of a sensor package according to a fifth modification, FIG. 8(a) is a plan view, FIG. 8(b) is a sectional view taken on the line A-A' in FIG. 8(a), FIG. 8(c) is a sectional view taken on the line B-B' in FIG. 8(a), and FIG. 8(d) is a sectional view taken on the line C-C' in FIG. 8(a).

FIGS. 9(a)-(e) illustrate a schematic configuration of a sensor package according to a sixth modification, FIG. 9(a) is a plan view, FIG. 9(b) is a sectional view taken on the line A-A' in FIG. 9(a), FIG. 9(c) is a sectional view taken on the line B-B' in FIG. 9(a), FIG. 9(d) is a sectional view taken on the line C-C' in FIG. 9(a), and FIG. 9(e) is a schematic diagram schematically illustrating a relationship of a resin flow during injection molding and a Young's modulus of a resin molded product.

FIGS. 10(a)-(d) illustrate a schematic configuration of a sensor package according to a seventh modification, FIG. 10(a) is a plan view, FIG. 10(b) is a sectional view taken on the line A-A' in FIG. 10(a), FIG. 10(c) is a sectional view taken on the line B-B' in FIG. 10(a), and FIG. 10(d) is a sectional view taken on the line C-C' in FIG. 10(a).

FIGS. 12(a)-(d) illustrate a schematic configuration of a sensor package according to a ninth modification, FIG. 12(a) is a plan view, FIG. 12(b) is a sectional view taken on the line A-A' in FIG. 12(a), FIG. 12(c) is a sectional view taken on the line B-B' in FIG. 12(a), and FIG. 12(d) is a sectional view taken on the line C-C' in FIG. 12(a).

FIGS. 13(a)-(d) illustrate a schematic configuration of a sensor package according to a tenth modification, FIG. 13(a) is a plan view, FIG. 13(b) is a sectional view taken on the line A-A' in FIG. 13(a), FIG. 13(c) is a sectional view taken on the line B-B' in FIG. 13(a), and FIG. 13(d) is a sectional view taken on the line C-C' in FIG. 13(a).

FIGS. 14(a)-(d) illustrate a schematic configuration of a sensor package according to an eleventh modification, FIG. 14(a) is a plan view, FIG. 14(b) is a sectional view taken on the line A-A' in FIG. 14(a), FIG. 14(c) is a sectional view taken on the line B-B' in FIG. 14(a), and FIG. 14(d) is a sectional view taken on the line C-C' in FIG. 14(a).

FIG. 17(a) is a sectional view, and FIG. 17(b) is a plan view.

DETAILED DESCRIPTION

Figure 2A:
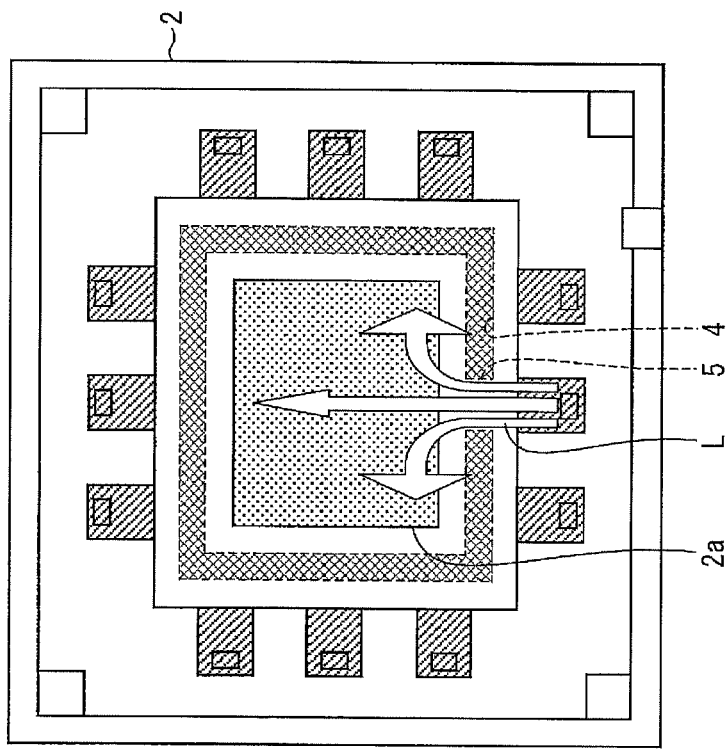
FIGS. 2(a)-(b) are views for explaining an effect of the sensor package in FIGS. 1(a)-(d)

Hereinafter, embodiments of the present invention will be described in detail with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.
(Configuration of Sensor Package)

FIGS. 1(a)-(e) illustrate a schematic configuration of a sensor package (hereinafter referred to as the sensor package) according to one or more embodiments of the present invention, FIG. 1(a) is a plan view, FIG. 1(b) is a sectional view taken on a line A-A' in FIG. 1(a), FIG. 1(c) is a sectional view taken on a line B-B' in FIG. 1(a), FIG. 1(d) is a sectional view taken on a line C-C' in FIG. 1(a).

As illustrated in FIGS. 1(a) to 1(d), the sensor package includes a semiconductor sensor chip 1 and a package body 2 that has a semiconductor sensor chip mounting region (a fixed surface) 2a to which the semiconductor sensor chip 1 is fixed. The package body 2 is made of resin, and formed into a rectangular box shape in which a principal surface side of the semiconductor sensor chip 1 is opened. The package body 2 is formed by injection molding. Although not illustrated in FIGS. 1(a) to 1(d), the sensor package includes a cover unit that closes the opening portion of the package body 2.

Plural terminal blocks 3 are provided in an inner bottom surface of the package body 2, and a connection pad 3a electrically connected to the semiconductor sensor chip 1 is formed in the terminal block 3. The connection pad 3a of the terminal block 3 is electrically connected to the semiconductor sensor chip 1 through a wire W.

In the package body 2, a groove 4 is formed in a rear surface 2b on an opposite side to the surface on which the semiconductor sensor chip 1 is mounted. The groove 4 is formed in the rear surface 2b so as to surround the semiconductor sensor chip mounting region 2a. The groove 4 acts as a stress relaxation unit that relaxes a stress when the sensor package is mounted on the board. The stress externally generated in mounting the sensor package is relaxed by the groove 4. In other words, a distortion generated in a bottom portion of the package body 2 in mounting the sensor package is hardly transmitted to the semiconductor sensor chip mounting region 2a. Therefore, a deformation of the semiconductor sensor chip mounting region 2a is reduced in mounting the sensor package, so that an influence of an external force applied to the semiconductor sensor chip 1 can be decreased.

A cross-linking section 5 is formed in the groove 4. The cross-linking section 5 is formed so as to cross-link sidewalls 4a and 4b constituting the groove 4. The cross-linking section 5 constitutes a coupling section that couples an inside resin portion (a resin portion on the side of the rear surface 2b including the semiconductor sensor chip mounting region 2a) surrounded by the groove 4 and a resin portion outside the groove 4.

In the case that the structure of the groove 4 in which the cross-linking section 5 is formed is formed by the injection molding, a metallic mold used in the injection molding has the configuration a notch is provided in part of the prismatic sidewall comparable to the groove 4. FIG. 1(e) is a sectional view illustrating the structure of the metallic mold corresponding to the sectional structure in FIG. 1(d). As illustrated in FIG. 1(e), a metallic mold 6 includes a prismatic sidewall 6a comparable to the groove 4 and a notch 6b comparable to the cross-linking section 5. The notch 6b acts as an inflow port through which the resin flows into the prismatic tube comparable to the groove 4.

Figure 2B:
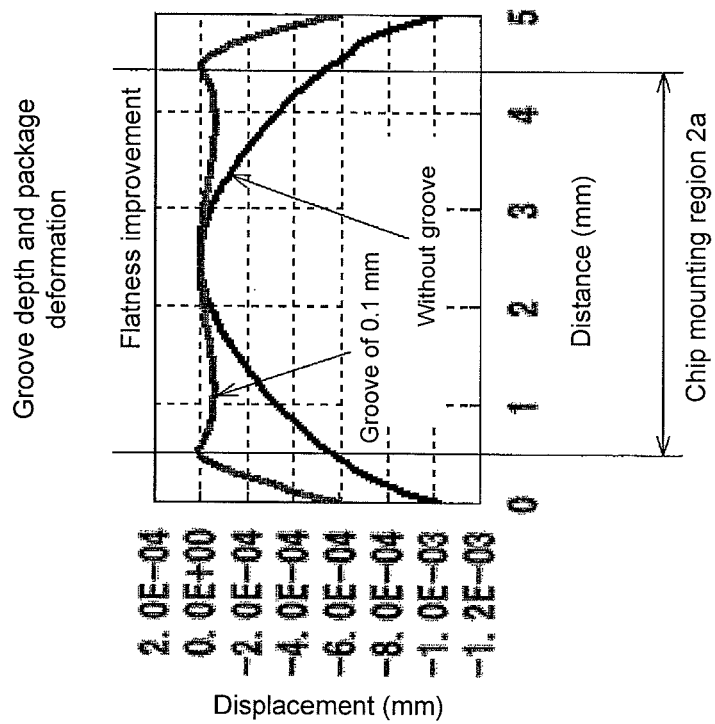

The effect of the sensor package will be described in detail with reference to FIGS. 2(a)-(d). FIGS. 2(a)-(d) are views for explaining the effect of the sensor package, FIG. 2(a) is a plan view for explaining moldability of the package body 2, and FIG. 2(b) is a graph illustrating a stress relaxation effect. FIG. 2(b) illustrates a comparison result of a deformation of the semiconductor sensor chip mounting region 2a with respect to the package body 2 in which the groove 4 is not formed and the package body 2 in which the groove 4 having a depth of 0.1 mm is formed.

In the case that the structure of the groove 4 in which the cross-linking section 5 is formed is formed by the injection molding using the metallic mold in FIG. 1(e), the resin flows in the region inside the prismatic tube comparable to the groove 4 (the flow of resin is designated by a symbol "L" in FIG. 2(a)) via the notch 6b comparable to the cross-linking section 5. In the package body 2 formed by the injection molding, the resin flows easily in the inside region surrounded by the groove 4, and sufficiently fills the inside region, so that the short-molding-free package can be constructed.

As can be seen from the graph in FIG. 2(b), the deformation of the semiconductor sensor chip mounting region 2a is significantly reduced by providing the groove 4. According to the sensor package, the stress externally generated in mounting the sensor package is relaxed by the groove 4.

As described above, according to the sensor package, the injection molding can easily be performed to the stress relaxation structure including the groove, in which the injection molding is hardly performed in the conventional technology, while the stress relaxation effect is maintained.

According to the sensor package, the groove 4 is formed in not the surface on which the semiconductor sensor chip 1 is mounted in the package body 2, but the rear surface 2b on the opposite side. In the case that the groove 4 is formed in the surface on which the semiconductor sensor chip 1 is mounted in the package body 2, the deformation of the semiconductor sensor chip mounting region 2a cannot be reduced.

Figure 3A:
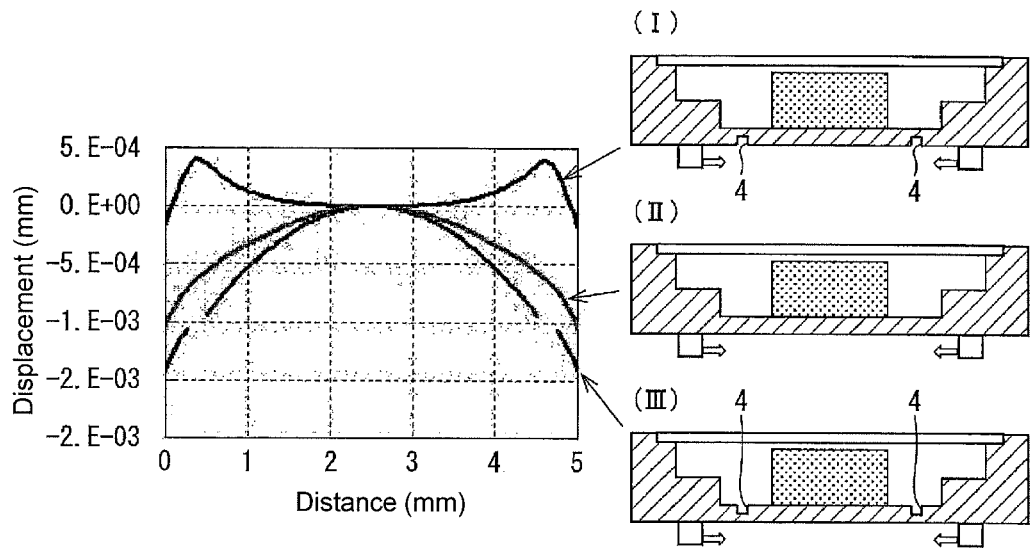
FIGS. 3(a)-(b) are views for explaining the stress relaxation effect of the sensor package in FIGS. 1(a)-(d)
Figure 3B:
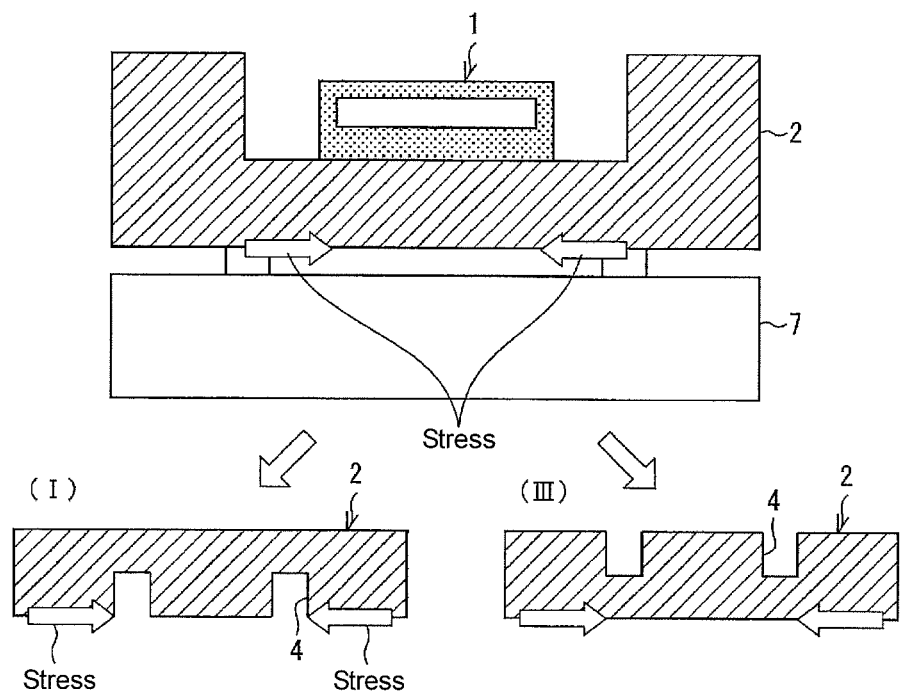

FIG. 3(a) is a graph illustrating a comparison result of the stress relaxation effect with respect to the configuration in which the groove 4 is formed in the surface on which the semiconductor sensor chip 1 is mounted and the configuration in which the groove 4 is formed in the rear surface on the opposite side to the surface on which the semiconductor sensor chip 1 is mounted. As illustrated in FIGS. 3(a)-(b), a configuration (III) in which the groove 4 is formed in the surface on which the semiconductor sensor chip 1 is mounted is smaller than a configuration (II) that does not include the groove 4 in the stress relaxation effect, and the semiconductor sensor chip mounting region 2a is easily deformed in the configuration (III). That is, the configuration (III) has an adverse effect from the viewpoint of the stress relaxation effect. Therefore, in the case that the groove 4 is formed in the surface on which the semiconductor sensor chip 1 is mounted in the package body 2, the deformation of the semiconductor sensor chip mounting region 2a cannot be reduced.

On the other hand, the configuration (I) in which the groove 4 is formed in the rear surface on the opposite side to the surface on which the semiconductor sensor chip 1 is mounted is significantly larger than the configurations (II) and (III) in the stress relaxation effect, and the deformation of the semiconductor sensor chip mounting region 2a is reduced in the configuration (I).

The stress generated in mounting the sensor package will be described in detail with reference to FIG. 3(b). FIG. 3(b) is a schematic diagram for explaining the stress generated in mounting the semiconductor sensor chip with respect to the sensor packages having the configurations (I) and (III) in FIG. 3(a).

As illustrated in FIG. 3(b), when the sensor package is mounted on a board 7, the stress generated by the external force is applied to the bottom surface of the package body 2 that is of a pad connection portion of the board 7 and the package body 2 (see an arrow in FIG. 3(b)). In the configuration (I), the groove 4 is formed in the rear surface (that is, the bottom surface) on the opposite side to the surface on which the semiconductor sensor chip 1 is mounted. In the configuration (I), stiffness decreases locally (the deformation is easily generated) in the region near the groove 4 in the rear surface on the opposite side to the semiconductor sensor chip 1. Therefore, in the configuration (I), the stress applied to the bottom surface is absorbed by the groove 4 to increase the stress relaxation effect.

On the other hand, in the configuration (III), because the groove 4 is formed in the surface on which the semiconductor sensor chip 1 is mounted, the stiffness increases locally (the deformation is hardly generated) in the region near the groove 4 in the rear surface on the opposite side to the semiconductor sensor chip 1. Therefore, in the configuration (III), the stress cannot be relaxed because the stress applied to the bottom surface is not absorbed by the groove 4 but remains.

As described above, it is found that the stress relaxation effect increases by forming the groove 4 in not the surface on which the semiconductor sensor chip 1 is mounted but the rear surface 2b on the opposite side. Therefore, according to the sensor package, the deformation of the semiconductor sensor chip mounting region 2a can be reduced.

The semiconductor sensor chip 1 accommodated in the sensor package is a diaphragm-type sensor chip including a diaphragm 1a as illustrated in FIGS. 1(b) to 1(d). A compact pressure sensor or vibration sensor includes the diaphragm (a sensitive region of a semiconductor thin film) 1a in order to detect a pressure or a vibration. Because the diaphragm-type sensor chip is subject to an influence of the stress generated in mounting the package, the diaphragm-type sensor chip is the sensor chip suitably accommodated in the sensor package. The semiconductor sensor chip 1 is not limited to the pressure sensor, but the semiconductor sensor chip 1 may be the vibration sensor, a microphone, a flow rate sensor, and the like as long as the semiconductor sensor chip 1 includes the diaphragm.

(First Modification)

In the configuration of the sensor package, a modification of the configuration in FIGS. 1(a) to 1(d) will be described below. FIGS. 4(a)-(d) illustrate a sensor package according to a first modification, FIG. 4(a) is a plan view, FIG. 4(b) is a sectional view taken on the line A-A' in FIG. 4(a), FIG. 4(c) is a sectional view taken on the line B-B' in FIG. 4(a), and FIG. 4(d) is a sectional view taken on the line C-C' in FIG. 4(a). The "semiconductor sensor chip 1" is omitted in FIG. 4(a) for the sake of convenience.

As illustrated in FIGS. 4(a) to 4(d), in the sensor package of the first modification, four cross-linking sections 5a to 5d are formed in the groove 4. Each of the cross-linking sections 5a to 5d is formed in each side of the rectangular groove 4 surrounding the semiconductor sensor chip mounting region 2a.

In the case that the structure of the groove 4 including the cross-linking sections 5a to 5d is formed by the injection molding using the metallic mold, the resin flows in the inside portion of the groove 4 through the four notches comparable to the cross-linking sections 5a to 5d. Therefore, the inside region surrounded by the groove 4 can surely be filled with the resin.

(Second Modification)

In the configuration of the sensor package, another modification of the configuration in FIGS. 1(a) to 1(d) will be described below. FIGS. 5(a)-(d) illustrate a sensor package according to a second modification, FIG. 5(a) is a plan view, FIG. 5(b) is a sectional view taken on the line A-A' in FIG. 5(a), FIG. 5(c) is a sectional view taken on the line B-B' in FIG. 5(a), and FIG. 5(d) is a sectional view taken on the line C-C' in FIG. 5(a). The "semiconductor sensor chip 1" is omitted in FIG. 5(a) for the sake of convenience.

As illustrated in FIGS. 5(a) to 5(d), in the sensor package of the second modification, the cross-linking sections 5b and 5d are formed in the rear surface 2b while biased onto a downstream side of a resin flow direction (an injection direction) L from a center line X of the semiconductor sensor chip mounting region 2a.

In the injection molding, the pressure at which the resin is injected runs short on the downstream side in the resin flow direction (a resin injection direction during the injection molding) and a short molding is easily generated. In the sensor package of the second modification, the cross-linking sections 5b and 5d are formed on the downstream side in the resin flow direction (the injection direction) L in which the injection pressure decreases, so that the sufficient injection pressure can be obtained during the injection molding. Therefore, the short molding can surely be improved. As a result, a yield ratio can be improved in the injection molding of the sensor package.

(Third Modification)

In the configuration of the sensor package, still another modification of the configuration in FIGS. 1(a) to 1(d) will be described below. FIGS. 6(a)-(d) illustrate a sensor package according to a third modification, FIG. 6(a) is a plan view, FIG. 6(b) is a sectional view taken on the line A-A' in FIG. 6(a), FIG. 6(c) is a sectional view taken on the line B-B' in FIG. 6(a), and FIG. 6(d) is a sectional view taken on the line C-C' in FIG. 6(a). The "semiconductor sensor chip 1" is omitted in FIG. 6(a) for the sake of convenience.

As illustrated in FIGS. 6(a) to 6(d), in the sensor package of the third modification, four cross-linking sections 5a' to 5d' are formed in the groove 4. A height h from the bottom surface of the groove 4 in each of the cross-linking sections 5a' to 5d' is less than a depth d of the groove 4.

In the sensor package of the third modification, the moldability is degraded compared with the sensor packages of the first and second modifications because the height h of each of the cross-linking sections 5a' to 5d' is less than the depth d of the groove 4. At the same time, the sensor package of the third modification is configured to have the stress relaxation effect higher than that of the sensor packages of the first and second modifications.

(Fourth Modification)

In the configuration of the sensor package, still another modification of the configuration in FIGS. 1(a) to 1(d) will be described below. FIGS. 7(a)-(d) illustrate a sensor package according to a fourth modification, FIG. 7(a) is a plan view, FIG. 7(b) is a sectional view taken on the line A-A' in FIG.

7(a), FIG. 7(c) is a sectional view taken on the line B-B' in FIG. 7(a), and FIG. 7(d) is a sectional view taken on the line C-C' in FIG. 7(a). The "semiconductor sensor chip 1" is omitted in FIG. 7(a) for the sake of convenience.

As illustrated in FIG. 7(d), in the sensor package of the fourth modification, a cross-linking section 5e is formed such that the height h from the bottom surface of the groove 4 increases toward a central portion from both ends in an extending direction of the groove 4. The cross-linking section 4e is formed in each side of the rectangular groove 4 surrounding the semiconductor sensor chip mounting region 2a.

A size of the cross-linking section 5e can largely be ensured. In the case that the structure of the groove 4 including the cross-linking section 5e is formed by the injection molding using the metallic mold, the size of the notch comparable to the cross-linking section 4e is enlarged, so that the resin can easily flow in the inside portion of the groove 4. Therefore, the inside region surrounded by the groove 4 can surely be filled with the resin.

There is no particular limitation to the shape of the cross-linking section 5e' as long as the height h increases toward the central portion from both the ends of the extending direction of the groove 4. The cross-linking section 5e' may have either a linear shape or a nonlinear shape.

(Fifth Modification)

In the configuration of the sensor package, still another modification of the configuration in FIGS. 1(a) to 1(d) will be described below. FIGS. 8(a)-(d) illustrate a sensor package according to a fifth modification, FIG. 8(a) is a plan view, FIG. 8(b) is a sectional view taken on the line A-A' in FIG. 8(a), FIG. 8(c) is a sectional view taken on the line B-B' in FIG. 8(a), and FIG. 8(d) is a sectional view taken on the line C-C' in FIG. 8(a). The "semiconductor sensor chip 1" is omitted in FIG. 8(a) for the sake of convenience.

The sensor package of the fifth modification differs from the sensor packages of the first to fourth modifications in the shape of the groove 4 surrounding the semiconductor sensor chip mounting region 2a.

As illustrated in FIG. 8(a), the groove 4 has the rectangular shape surrounding the semiconductor sensor chip mounting region 2a, and includes grooves 4c each of which extends outward from a corner of the rectangular shape. In the case that the groove 4 is formed into the rectangular shape surrounding the semiconductor sensor chip mounting region 2a, there is a risk of concentrating the stress on the corner of the rectangular shape. In the sensor package of the fifth modification, the stress generated in the corner of the rectangular shape is relaxed because the groove 4c is formed in the corner of the rectangular shape.

Therefore, in the sensor package of the fifth modification, the deformation of the semiconductor sensor chip mounting region 2a due to the sensor package mounting is reduced, and the semiconductor sensor chip 1 increases a resistance property against the external force.

(Sixth Modification)

In the configuration of the sensor package, still another modification of the configuration in FIGS. 1(a) to 1(d) will be described below. FIGS. 9(a)-(e) illustrate a sensor package according to a sixth modification, FIG. 9(a) is a plan view, FIG. 9(b) is a sectional view taken on the line A-A' in FIG. 9(a), FIG. 9(c) is a sectional view taken on the line B-B' in FIG. 9(a), FIG. 9(d) is a sectional view taken on the line C-C' in FIG. 9(a), and FIG. 9(e) is a schematic diagram schematically illustrating a relationship of a resin flow during injection molding and a Young's modulus of a resin molded product. The "semiconductor sensor chip 1" is omitted in FIG. 9(a) for the sake of convenience.

As illustrated in FIG. 9(a), the groove 4 is formed in a portion except the corners of the rectangle surrounding the semiconductor sensor chip mounting region 2a. A resin portion 5' in the corner in which the groove 4 is not formed constitutes the coupling section that couples the inside resin portion surrounded by the groove 4 and the resin portion outside the groove 4.

In the case that the sensor package of the sixth modification is formed by the injection molding using the metallic mold, a structure object comparable to the resin portion 5' constitutes the inflow port through which the resin flows. Generally, as illustrated in FIG. 9(e), the resin molded product produced by the injection molding has a characteristic in which the Young's modulus in the resin flow direction (the injection direction) L is larger than the Young's modulus in the direction perpendicular to the resin flow direction depending on an orientation of material resin fiber. As illustrated in FIG. 9(a), using the characteristic, the structure having the higher stress relaxation effect can be constructed by injecting the resin in the four directions from the four corners of the rectangle surrounding the semiconductor sensor chip mounting region 2a.

(Seventh Modification)

In the configuration of the sensor package, still another modification of the configuration in FIGS. 1(a) to 1(d) will be described below. FIGS. 10(a)-(d) illustrate a sensor package according to a seventh modification, FIG. 10(a) is a plan view, FIG. 10(b) is a sectional view taken on the line A-A' in FIG. 10(a), FIG. 10(c) is a sectional view taken on the line B-B' in FIG. 10(a), and FIG. 10(d) is a sectional view taken on the line C-C' in FIG. 10(a). The "semiconductor sensor chip 1" is omitted in FIG. 10(a) for the sake of convenience.

As illustrated in FIGS. 10(a) to 10(d), in the sensor package of the seventh modification, the grooves 4 are formed in two sides parallel to each other in the rectangle surrounding the semiconductor sensor chip mounting region 2a. Resin portions 5" in the residual two sides in each of which the groove 4 is not formed constitute the coupling section that couples the inside resin portion surrounded by the grooves 4 and the resin portion outside the groove 4. The terminal block 3 that is electrically connected to the semiconductor sensor chip 1 is not provided in the residual two sides in each of which the groove 4 is not formed in the semiconductor sensor chip mounting region 2a.

The grooves 4 are formed in the two sides of the four sides of the rectangle surrounding the semiconductor sensor chip mounting region 2a, which allows the residual two sides to be ensured as the inflow port of the resin during the injection molding. Therefore, the inside region surrounded by the grooves 4 can surely be filled with the resin, and the injection molding is more easily performed.

In the sensor package of the seventh modification, the grooves 4 may be formed in at least two sides of the rectangle surrounding the semiconductor sensor chip mounting region 2a.

(Eighth Modification)

Figure 11:
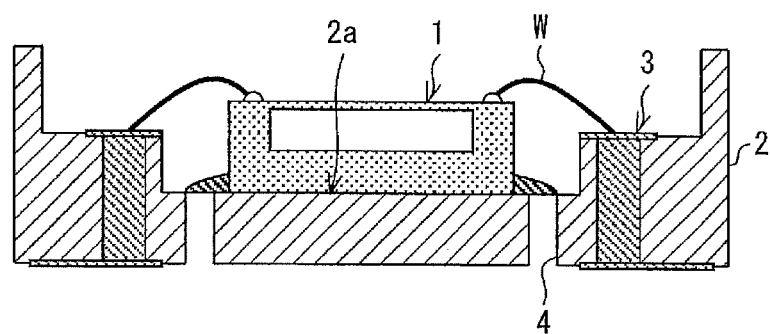
FIG. 11 is a sectional view illustrating a schematic configuration of a sensor package according to an eighth modification.
Figure 15:
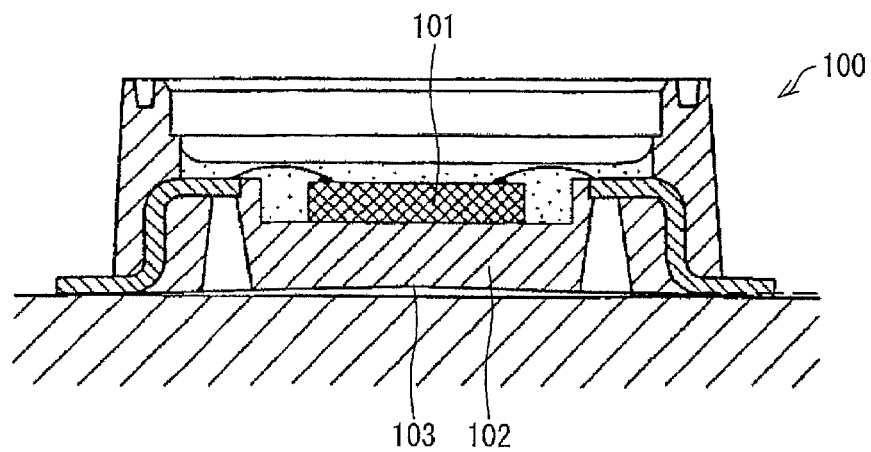
FIG. 15 is a sectional view illustrating a configuration of a resin mold package disclosed in Patent Document 1.
Figure 16:
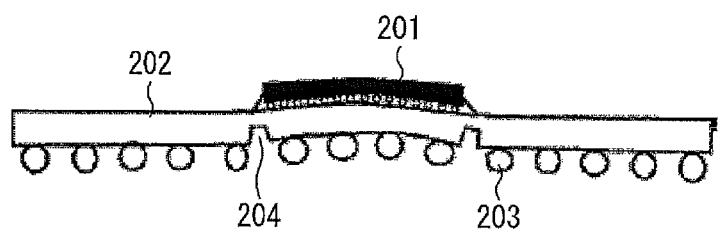
FIG. 16 is a view illustrating a configuration of a flip-chip BGA package disclosed in Patent Document 2.
Figure 17A:
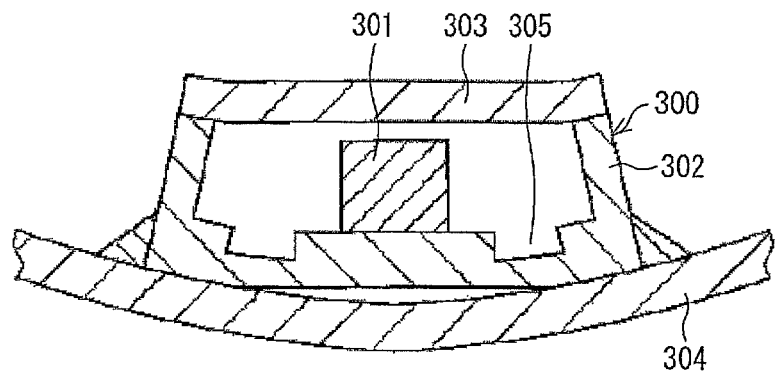
FIGS. 17(a)-(b) illustrate a configuration of a sensor package disclosed in Patent Document 3.
Figure 17B:
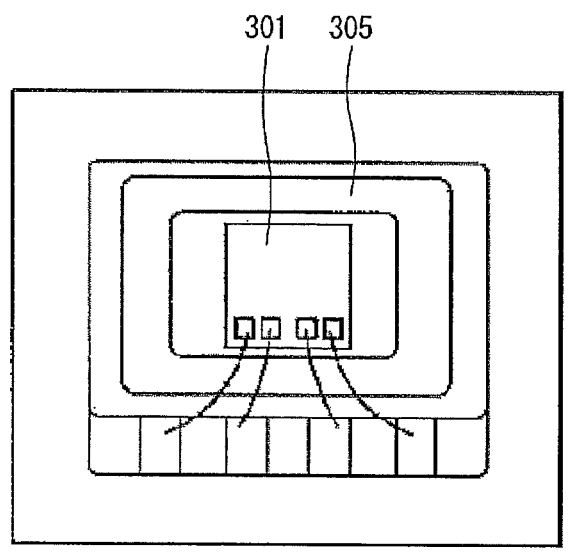
Figure 18:
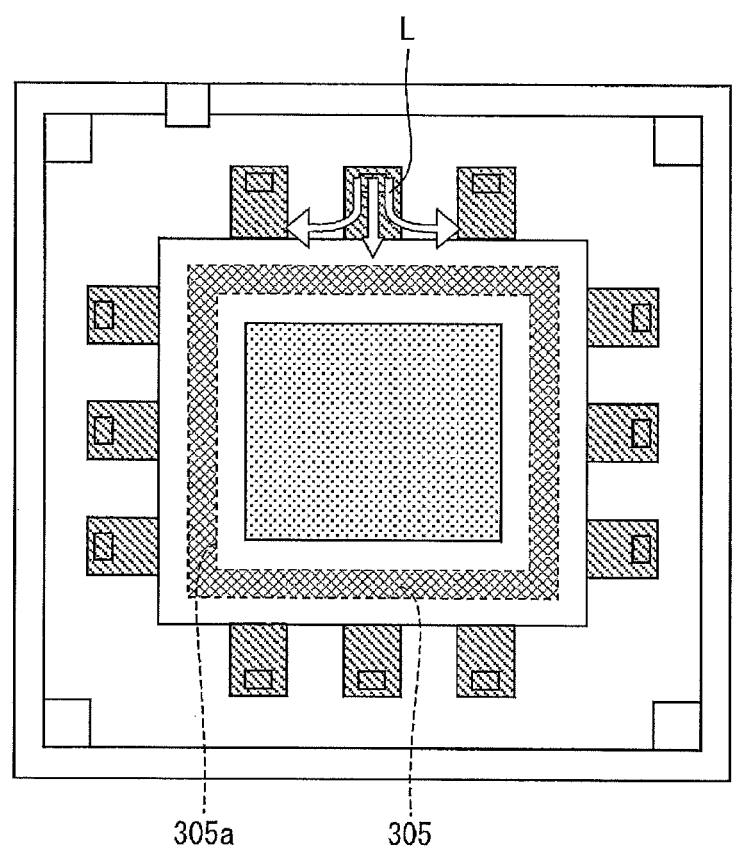
FIG. 18 is a plan view for explaining forming a structure, in which the groove is formed along four sides in a semiconductor element mounting region, by the injection molding.

In the configuration of the sensor package, still another modification of the configuration in FIGS. 1(a) to 1(d) will be described below. FIG. 11 is a sectional view illustrating a schematic configuration of a sensor package according to an eighth modification.

As illustrated in FIG. 11, in the sensor package of the eighth modification, the groove 4 is formed so as to pierce the bottom of the package body 2 on which the semiconductor sensor chip is mounted. The semiconductor sensor chip mounting region 2a is completely separated from the package body 2. Therefore, the stress applied to the semiconductor sensor chip mounting region 2a can be decreased.

The structure of the sensor package of the eighth modification can be applied to the sensor package in FIGS. 1(a) to (d) and the sensor packages of the first to seventh modifications.

(Ninth Modification)

In the configuration of the sensor package, still another modification of the configuration in FIGS. 1(a) to 1(d) will be described below. FIGS. 12(a)-(d) illustrate a sensor package according to a ninth modification, FIG. 12(a) is a plan view, FIG. 12(b) is a sectional view taken on the line A-A' in FIG. 12(a), FIG. 12(c) is a sectional view taken on the line B-B' in FIG. 12(a), and FIG. 12(d) is a sectional view taken on the line C-C' in FIG. 12(a). The "semiconductor sensor chip 1" is omitted in FIG. 12(a) for the sake of convenience.

As illustrated in FIGS. 12(a) to 12 (d), in the sensor package of the ninth modification, the groove 4 is formed into a double rectangular shape surrounding the semiconductor sensor chip mounting region 2a. Therefore, the deformation of the semiconductor sensor chip mounting region 2a can be reduced against the external stress during the sensor package mounting.

Each of the cross-linking sections 5a to 5d cross-links the sidewall constituting the groove 4 of each side of the double rectangle. Therefore, the injection molding is easily performed.

(Tenth Modification)

In the configuration of the sensor package, still another modification of the configuration in FIGS. 1(a) to 1(d) will be described below. FIGS. 13(a)-(d) illustrate a sensor package according to a tenth modification, FIG. 13(a) is a plan view, FIG. 13(b) is a sectional view taken on the line A-A' in FIG. 13(a), FIG. 13(c) is a sectional view taken on the line B-B' in FIG. 13(a), and FIG. 13(d) is a sectional view taken on the line C-C' in FIG. 13(a). The "semiconductor sensor chip 1" is omitted in FIG. 13(a) for the sake of convenience.

As illustrated in FIGS. 13(a) to 13(d), in the sensor package of the tenth modification, the groove 4 is formed into a spiral shape surrounding the semiconductor sensor chip mounting region 2a. A resin portion 5''' from an entrance 5'''a to an exit 5'''b in the spiral formed by the groove 4 constitutes the coupling section that couples the inside resin portion surrounded by the groove 4 and the resin portion outside the groove 4.

A flow path in which the resin flows into the semiconductor sensor chip mounting region 2a can be ensured by forming the groove 4 into the spiral shape surrounding the semiconductor sensor chip mounting region 2a. Therefore, the inside region (the semiconductor sensor chip mounting region 2a) surrounded by the grooves 4 can surely be filled with the resin, and the injection molding is more easily performed.

(Eleventh Modification)

In the configuration of the sensor package, still another modification of the configuration in FIGS. 1(a) to 1(d) will be described below. FIGS. 14(a)-(d) illustrate a sensor package according to an eleventh modification, FIG. 14(a) is a plan view, FIG. 14(b) is a sectional view taken on the line A-A' in FIG. 14(a), FIG. 14(c) is a sectional view taken on the line B-B' in FIG. 14(a), and FIG. 14(d) is a sectional view taken on the line C-C' in FIG. 14(a). The "semiconductor sensor chip 1" is omitted in FIG. 14(a) for the sake of convenience.

As illustrated in FIGS. 14(a) to 14(d), in the sensor package of the eleventh modification, the groove 4 is formed into a double rectangular shape surrounding the semiconductor sensor chip mounting region 2a. The groove 4 having one rectangular shape in the double rectangular shape is formed in the region immediately below the semiconductor sensor chip mounting region 2a. Therefore, the stress remaining below the semiconductor sensor chip mounting region 2a can be removed to increase the stress relaxation effect.

Each of the cross-linking sections 5a to 5d cross-links the sidewall constituting the groove 4 of each side of the double rectangle. Therefore, the injection molding is easily performed.

The present invention is not limited to the above modifications, but various changes can be made without departing from the scope of the present invention. The technical scope of the present invention also includes an embodiments obtained by a proper combination of technical means disclosed in the different modifications.

A sensor package according to one or more embodiments of the present invention includes: a semiconductor sensor chip; and a package body that has a semiconductor sensor chip mounting region on which the semiconductor sensor chip is mounted, the package body being a resin injection molded product. Herein, a groove is formed in a rear surface on an opposite side to a surface, on which the semiconductor sensor chip is mounted, so as to surround the semiconductor sensor chip mounting region, and a coupling section is formed in the rear surface to couple a resin portion inside the groove and a resin portion outside the groove.

Therefore, advantageously the injection molding can easily be performed to the stress relaxation structure including the groove in which the injection molding is hardly performed in the conventional technology, while the stress relaxation effect is maintained.

In the sensor package according to one or more embodiments of the present invention, the coupling section may be formed as a cross-linking section that cross-links sidewalls constituting the groove.

In the sensor package according to one or more embodiments of the present invention, the groove is formed into a rectangular shape surrounding the semiconductor sensor chip mounting region, and the coupling section is formed in the groove of each side of the rectangular shape. Therefore, during the injection molding for the groove structure, the resin flows more easily into the inside region of the groove, and the inside region of the groove can surely be filled with the resin.

In the sensor package according to one or more embodiments of the present invention, the coupling section is formed while biased onto a downstream side in a resin injection direction during injection molding from a central portion of the semiconductor sensor chip mounting region.

In the injection molding, the pressure at which the resin is injected runs short on the downstream side in the resin injection direction during the injection molding, and the short molding is easily generated. According to the above configuration, the coupling section is formed while biased onto the downstream side in the resin injection direction during the injection molding from the central portion in the semiconductor sensor chip mounting region, so that the sufficient injection pressure can be obtained during the injection molding. Therefore, according to the configuration, the short molding can surely be improved, and yield ratio can be improved in the injection molding of the sensor package.

In the sensor package according to one or more embodiments of the present invention, a height from a bottom surface of the groove in the coupling section is smaller than a depth of the groove. Therefore, the stress relaxation effect can be improved.

In the sensor package according to one or more embodiments of the present invention, the coupling section is formed such that the height from the bottom surface of the groove increases toward the central portion from both ends in an extending direction of the groove.

Therefore, the size of the coupling section can largely be ensured. The size of the notch of the metallic mold used in the injection molding for the groove structure is enlarged according to the coupling section. Accordingly, in the case that the groove structure is formed by the injection molding, the resin flows easily into the inside region of the groove. Therefore, according to the configuration, the inside region surrounded by the groove can more surely be filled with the resin.

In the sensor package according to one or more embodiments of the present invention, the groove is formed into the rectangular shape surrounding the semiconductor sensor chip mounting region, and the groove extends outward from a corner of the rectangle.

According to the configuration, the groove is formed into the rectangular shape surrounding the semiconductor sensor chip mounting region, and the groove extends outward from the corner of the rectangle, thereby relaxing the stress generated in the corner of the rectangle. Therefore, the deformation of the semiconductor sensor chip mounting region due to the sensor package mounting is reduced, and the semiconductor sensor chip increases the resistance property against the external force.

In the sensor package according to one or more embodiments of the present invention, the groove is formed in a portion except the corner of the rectangle surrounding the semiconductor sensor chip mounting region, a resin portion of the corner in which the groove is not formed constitutes the coupling section.

According to the configuration, the structure having the higher stress relaxation effect can be constructed by injecting the resin in the four directions from the four corners of the rectangle surrounding the semiconductor sensor chip mounting region.

In the sensor package according to one or more embodiments of the present invention, the groove is not formed in at least one of four sides of the rectangle surrounding the semiconductor sensor chip mounting region, the groove is formed in the residual sides, and a resin portion of the side in which the groove is not formed constitutes the coupling section. Therefore, the inside region surrounded by the grooves can surely be filled with the resin, and the injection molding is more easily performed.

In the sensor package according to one or more embodiments of the present invention, the groove is formed so as to pierce a bottom of the package body on which the semiconductor sensor chip is mounted. The semiconductor sensor chip mounting region is completely separated from the package body. Therefore, the stress applied to the semiconductor sensor chip mounting region can be decreased.

In the sensor package according to one or more embodiments of the present invention, the groove is formed into multiple rectangular shapes surrounding the semiconductor sensor chip mounting region.

Therefore, the deformation of the semiconductor sensor chip mounting region can be reduced against the external stress during the sensor package mounting.

In the sensor package according to one or more embodiments of the present invention, at least one rectangular groove in the multiple rectangular grooves is formed immediately below the semiconductor sensor chip mounting region.

Therefore, the stress remaining below the semiconductor sensor chip mounting region can be removed to increase the stress relaxation effect.

In the sensor package according to one or more embodiments of the present invention, the groove is formed into a spiral shape surrounding the semiconductor sensor chip mounting region, and a resin portion from an entrance to an exit of the spiral constitutes the coupling section.

Therefore, the flow path in which the resin flows in the semiconductor sensor chip mounting region can be ensured in performing the injection molding. Therefore, the inside region surrounded by the grooves can surely be filled with the resin, and the injection molding is more easily performed.

In the sensor package according to one or more embodiments of the present invention, the semiconductor sensor chip is a diaphragm-type sensor chip.

Because the diaphragm-type sensor chip is subject to the influence of the stress generated during the package mounting, the diaphragm-type sensor chip is the sensor chip suitably accommodated in the sensor package according to one or more embodiments of the present invention.

In the sensor package according to one or more embodiments of the present invention, the injection molding can easily be performed to the stress relaxation structure including the groove, in which the injection molding is hardly performed in the conventional technology, while the stress relaxation effect is maintained. Therefore, the sensor package according to one or more embodiments of the present invention can be applied to the sensor package in which the diaphragm-equipped semiconductor sensor such as the pressure sensor is accommodated, and the pressure sensor is used in an altimeter, a water pressure meter, and the like.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

Description Of Symbols
1 semiconductor sensor chip
2 package body
3 terminal block
4 groove
5 cross-linking section (coupling section)
5a-5d cross-linking section (coupling section)
5', 5", 5''' resin portion (coupling section)
6 metallic mold
7 board

The invention claimed is:

1. A sensor package comprising:
a semiconductor sensor chip; and
a package body that has a semiconductor sensor chip mounting region on which the semiconductor sensor chip is mounted, the package body being a resin injection molded product, wherein
a groove is formed in a rear surface on an opposite side to a surface, on which the semiconductor sensor chip is mounted, so as to surround the semiconductor sensor chip mounting region, and
a coupling section is formed in the rear surface to couple a resin portion inside the groove and a resin portion outside the groove.

2. The sensor package according to claim 1, wherein
the coupling section is formed as a cross-linking section that cross-links sidewalls constituting the groove.

3. The sensor package according to claim 1, wherein
the groove is formed into a rectangular shape surrounding the semiconductor sensor chip mounting region, and
the coupling section is formed in the groove of each side of the rectangular shape.

4. The sensor package according to claim 1, wherein the coupling section is formed while biased onto a downstream side in a resin injection direction during injection molding from a central portion of the semiconductor sensor chip mounting region.

5. The sensor package according to claim 1, wherein a height from a bottom surface of the groove in the coupling section is smaller than a depth of the groove.

6. The sensor package according to claim 1, wherein the coupling section is formed such that the height from the bottom surface of the groove increases toward the central portion from both ends in an extending direction of the groove.

7. The sensor package according to claim 1, wherein the groove is formed into the rectangular shape surrounding the semiconductor sensor chip mounting region, and the groove extends outward from a corner of the rectangle.

8. The sensor package according to claim 1, wherein the groove is formed in a portion except the corner of the rectangle surrounding the semiconductor sensor chip mounting region, a resin portion of the corner in which the groove is not formed constitutes the coupling section.

9. The sensor package according to claim 1, wherein the groove is not formed in at least one of four sides of the rectangle surrounding the semiconductor sensor chip mounting region, the groove is formed in the residual sides, and a resin portion of the side in which the groove is not formed constitutes the coupling section.

10. The sensor package according to claim 1, wherein the groove is formed so as to pierce a bottom of the package body on which the semiconductor sensor chip is mounted.

11. The sensor package according to claim 1, wherein the groove is formed into multiple rectangular shapes surrounding the semiconductor sensor chip mounting region.

12. The sensor package according to claim 11, wherein at least one rectangular groove in the multiple rectangular grooves is formed immediately below the semiconductor sensor chip mounting region.

13. The sensor package according to claim 1, wherein the groove is formed into a spiral shape surrounding the semiconductor sensor chip mounting region, and a resin portion from an entrance to an exit of the spiral constitutes the coupling section.

14. The sensor package according to claim 1, wherein the semiconductor sensor chip is a diaphragm-type sensor chip.

* * * * *